US008869081B2

(12) United States Patent
Saleh et al.

(10) Patent No.: US 8,869,081 B2
(45) Date of Patent: Oct. 21, 2014

(54) AUTOMATING INTEGRATED CIRCUIT DEVICE LIBRARY GENERATION IN MODEL BASED METROLOGY

(71) Applicants: International Business Machines Corporation, Armonk, NY (US); GLOBALFOUNDRIES Inc., Grand Cayman Islands (KY)

(72) Inventors: Nedal Saleh, Santa Clara, CA (US); Alok Vaid, Ballston Lake, NY (US)

(73) Assignees: International Business Machines Corporation, Armonk, NY (US); Global Foundries, Inc., Grand Cayman Islands (KY)

( * ) Notice: Subject to any disclaimer, the term of this patent is extended or adjusted under 35 U.S.C. 154(b) by 0 days.

(21) Appl. No.: 13/741,645

(22) Filed: Jan. 15, 2013

(65) Prior Publication Data

US 2014/0201693 A1 Jul. 17, 2014

(51) Int. Cl.
*G06F 17/50* (2006.01)

(52) U.S. Cl.
CPC ....................................... *G06F 17/50* (2013.01)
USPC ........... 716/106; 716/102; 716/110; 716/111; 716/112; 716/132; 716/136; 716/54; 716/55; 703/1; 703/13; 703/14

(58) Field of Classification Search
USPC ............. 716/54, 55, 102, 106, 110, 111, 112, 716/132, 136; 703/1, 13, 14
See application file for complete search history.

(56) References Cited

U.S. PATENT DOCUMENTS

| | | | |
|---|---|---|---|
| 7,084,990 B2 * | 8/2006 | Sasazawa et al. ............. 356/636 |
| 7,305,645 B1 * | 12/2007 | Capodieci et al. ............ 716/129 |
| 7,308,668 B2 | 12/2007 | Bueti et al. |
| 7,352,451 B2 * | 4/2008 | Levinski et al. .............. 356/123 |
| 7,382,447 B2 * | 6/2008 | Mieher et al. ................. 356/125 |
| 7,566,517 B1 * | 7/2009 | Adel et al. ........................ 430/5 |
| 7,656,512 B2 * | 2/2010 | Mieher et al. ................. 356/125 |
| 7,948,636 B2 * | 5/2011 | De Groot et al. ............. 356/511 |
| 8,110,800 B2 * | 2/2012 | Shishido et al. .............. 250/311 |
| 8,144,338 B2 * | 3/2012 | Mitsui .......................... 356/604 |
| 8,381,140 B2 * | 2/2013 | Hench et al. .................... 716/52 |
| 8,386,969 B2 * | 2/2013 | Hsu et al. ........................ 716/54 |
| 8,468,471 B2 * | 6/2013 | Liu et al. ......................... 716/54 |
| 8,481,936 B2 * | 7/2013 | Shishido et al. .............. 250/311 |
| 2003/0223087 A1 * | 12/2003 | Sasazawa et al. ............. 356/636 |
| 2004/0122636 A1 * | 6/2004 | Adam .............................. 703/2 |
| 2004/0147121 A1 * | 7/2004 | Nakagaki et al. ............. 438/689 |
| 2004/0181768 A1 * | 9/2004 | Krukar ............................ 716/19 |
| 2008/0248598 A1 * | 10/2008 | Pal et al. ........................... 438/8 |
| 2010/0046006 A1 * | 2/2010 | Mitsui .......................... 356/604 |

(Continued)

*Primary Examiner* — Helen Rossoshek
(74) *Attorney, Agent, or Firm* — Yuanmin Cai; Hoffman Warnick LLC

(57) ABSTRACT

Various embodiments include computer-implemented methods, computer program products and systems for generating an integrated circuit (IC) library for use in a scatterometry analysis. In some cases, approaches include: obtaining chip design data about at least one IC chip; obtaining user input data about the at least one IC chip; and running an IC library defining program using the chip design data in its original format and the user input data in its original format, the running of the IC library defining program including: determining a process variation for the at least one IC chip based upon the chip design data and the user input data; converting the process variation into shape variation data; and providing the shape variation data in a text format to a scatterometry modeling program for use in the scatterometry analysis.

15 Claims, 9 Drawing Sheets

(56) References Cited

U.S. PATENT DOCUMENTS

| | | |
|---|---|---|
| 2012/0123748 A1* | 5/2012 | Aben et al. .................. 703/2 |
| 2012/0151428 A1* | 6/2012 | Tanaka et al. ............... 716/112 |
| 2012/0206703 A1* | 8/2012 | Bhattacharyya et al. ....... 355/67 |
| 2012/0243004 A1* | 9/2012 | El Gawhary et al. ......... 356/601 |
| 2012/0317530 A1 | 12/2012 | Keene et al. |
| 2012/0330592 A1* | 12/2012 | Bottiglieri et al. ............ 702/85 |
| 2013/0050700 A1* | 2/2013 | Osten et al. ................. 356/369 |
| 2013/0066597 A1* | 3/2013 | Van Beurden .................. 703/1 |
| 2013/0132036 A1* | 5/2013 | Saleh ......................... 702/189 |
| 2013/0144560 A1* | 6/2013 | Pisarenco et al. ............ 702/189 |
| 2013/0215404 A1* | 8/2013 | Den Boef ...................... 355/44 |
| 2013/0271740 A1* | 10/2013 | Quintanilha .................. 355/67 |

* cited by examiner

AUTOMATING INTEGRATED CIRCUIT DEVICE LIBRARY GENERATION IN MODEL BASED METROLOGY

TECHNICAL FIELD

Aspects of the invention relate generally to integrated circuits. More particularly, various aspects of the invention relate to metrology in integrated circuits.

BACKGROUND

Developing and testing integrated circuit (IC) devices, also referred to as semiconductor devices, involves designing, manufacturing and testing these devices according to desired operating parameters. Quality assurance has been a concern in the development, fabrication and testing of IC devices, but is particularly important as these devices become ever more complex.

As IC devices have evolved from two-dimensional (2D) to three-dimensional (3D) structures, quality assurance methods are evolved as well. The quality assurance process is also referred to as "metrology." Older metrologies used at the 2D level include using a critical dimension scanning electron microscope (CDSEM) to analyze 2D structures formed according to a particular design and manufacturing process.

Currently, scatterometry (a type of optical-based metrology also referred to as optical critical dimension, or OCD) is being used as a metrology technique for 3D or other complex IC structures. Scatterometry involves propelling light at an IC structure (e.g., a device, array and/or chip, which may be at a nanometer (nm) scale) and detecting how that light scatters. The manner in which the light scatters indicates the quality (dimensions) of the IC structure as compared to a desired model. Scatterometry can help to identify issues between layers of a structure, as well as within or between buried devices or objects in a structure. Scatterometry is an attractive metrology for a number of reasons, one of which is that it is generally non-destructive. That is, the IC structure tested via scatterometry need not be discarded after testing (as in older metrologies). Scatterometry also allows for high throughput, meaning that a large number of structures can be tested within a short period of time.

The term "model-based metrology" refers to the conventional process of using scatterometry by building a model of how an expected IC structure scatter the light, and comparing the measured scatterometry data to that model. The model is essentially a database that includes a variety of diffraction signatures for the 3D structure. However, the model-based nature of scatterometry means that this approach is highly model and structure dependent, with a very long lead-time. Being model-based, conventional scatterometry relies upon providing and updating a large database with information about dimensions and parameters of IC structures.

BRIEF SUMMARY

Various embodiments include computer-implemented methods, computer program products and systems for generating an integrated circuit (IC) library for use in a scatterometry analysis. In some cases, approaches include: obtaining chip design data about at least one IC chip; obtaining user input data about the at least one IC chip; and running an IC library defining program using the chip design data in its original format and the user input data in its original format, the running of the IC library defining program including: determining a process variation for the at least one IC chip based upon the chip design data and the user input data; converting the process variation into shape variation data; and providing the shape variation data in a text format for use by a scatterometry modeling program in the scatterometry analysis.

A first aspect includes a computer-implemented method of generating an integrated circuit (IC) library for use in a scatterometry analysis, the method including: obtaining chip design data about at least one IC chip; obtaining user input data about the at least one IC chip; and running an IC library defining program using the chip design data in its original format and the user input data in its original format, the running of the IC library defining program including: determining a process variation for the at least one IC chip based upon the chip design data and the user input data; converting the process variation into shape variation data; and providing the shape variation data in a text format for use by a scatterometry modeling program in the scatterometry analysis.

A second aspect includes a system having: at least one computing device configured to generate an integrated circuit (IC) library for use in a scatterometry analysis by performing actions including: obtaining chip design data about at least one IC chip; obtaining user input data about the at least one IC chip; and running an IC library defining program using the chip design data in its original format and the user input data in its original format, the running of the IC library defining program including: determining a process variation for the at least one IC chip based upon the chip design data and the user input data; converting the process variation into shape variation data; and providing the shape variation data in a text format for use by a scatterometry modeling program in the scatterometry analysis.

A third aspect includes a computer program product including program code, which when executed on at least one computing device, causes the at least one computing device to generate an integrated circuit (IC) library for use in a scatterometry analysis by performing actions including: obtaining chip design data about at least one IC chip; obtaining user input data about the at least one IC chip; and running an IC library defining program using the chip design data in its original format and the user input data in its original format, the running of the IC library defining program including: determining a process variation for the at least one IC chip based upon the chip design data and the user input data; converting the process variation into shape variation data; and providing the shape variation data in a text format for use by a scatterometry modeling program in the scatterometry analysis.

Figure 1:
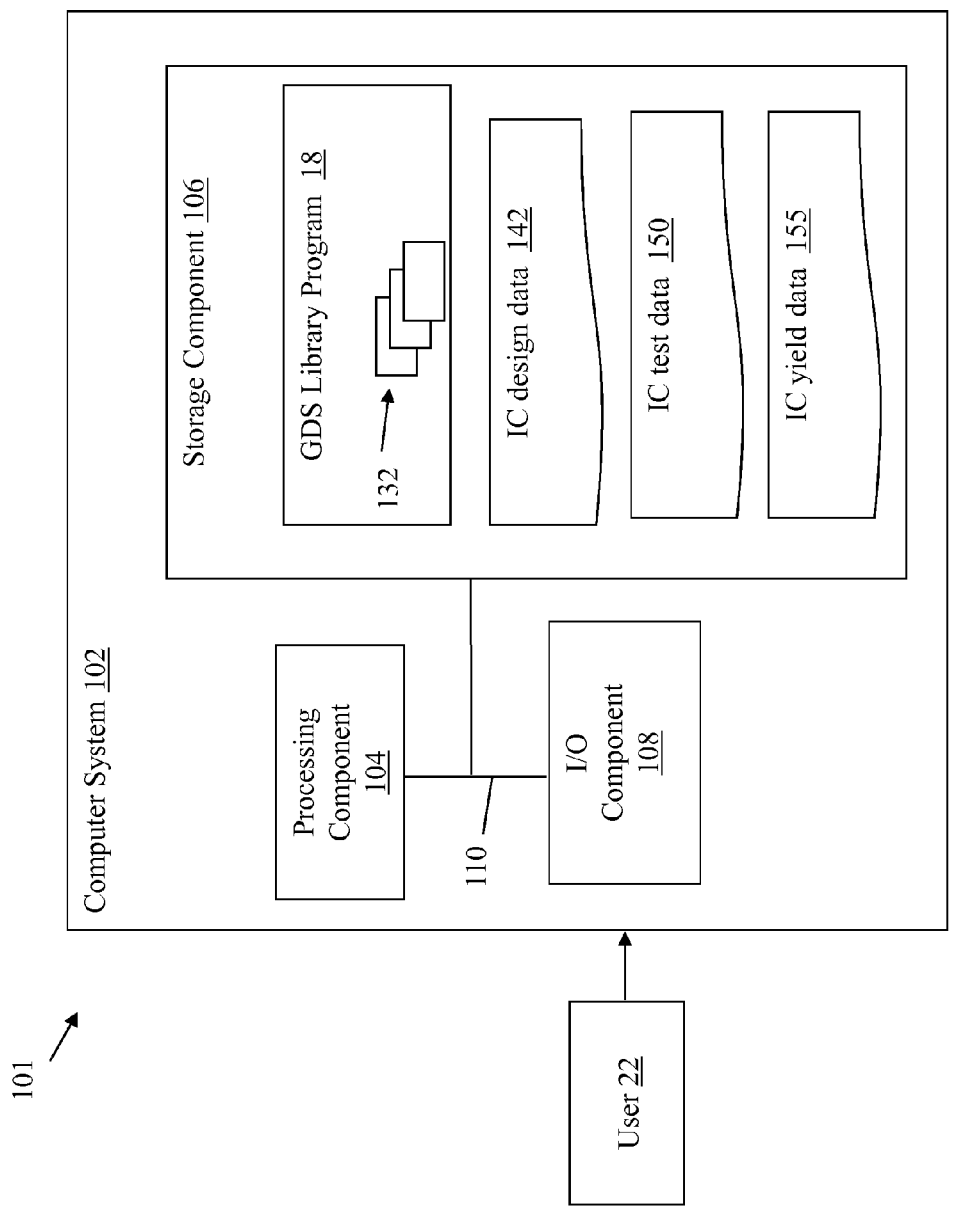
FIG. 1 shows a schematic environment for implementing an integrated circuit (IC) scatterometry library program according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

This invention relates generally to integrated circuits. More particularly, various aspects of the invention relate to model building in integrated circuits.

As described herein, scatterometry (a type of optical-based metrology also referred to as optical critical dimension scatterometry, or OCD) is being used as a metrology technique for 3D or other complex IC structures. Scatterometry involves propelling light at an IC structure (e.g., a device, array and/or chip, which may be at a nanometer (nm) scale) and detecting how that light scatters. The manner in which the light scatters indicates the quality of the IC structure as compared to a desired model. Scatterometry can help to identify issues between layers of a structure, as well as within or between buried devices or objects in a structure. Scatterometry is an attractive metrology for a number of reasons, one of which is that it is generally non-destructive. That is, the IC structure tested via scatterometry need not be discarded after testing (as in older metrologies). Scatterometry also allows for high throughput, meaning that a large number of structures can be tested within a short period of time.

The term "model-based metrology" refers to the conventional process of using scatterometry by building a model of how an expected IC structure should scatter light based on known algorithms, e.g., a Rigorous Coupled Wave Analysis (RCWA), and comparing the measured scatterometry data to that model. The model is essentially a database that includes a variety of diffraction signatures for the 3D structure. However, the model-based nature of scatterometry means that this approach is highly data dependent. Being model-based, conventional scatterometry relies upon providing and updating a large database with information about dimensions and parameters of IC structures.

In order to address the issues associated with conventional scatterometry approaches, various embodiments of the invention include computer-implemented methods, computer program products, and computer systems which automate generation of a library (or database including models) for a scatterometry analysis. In various embodiments, the approaches can be embedded in a software-based platform (e.g., in program code), which can be implemented using existing scatterometry hardware and software. In some cases herein, the software-based platform is referred to as GDS2LIB (GDS library program). GDS2LIB can convert IC process data and IC variation data to properly parametrize dimensional shapes that scatterometry software uses as inputs to automatically generate a library (database of models) for the scatterometry process. As noted, in various embodiments, implementing GDS2LIB requires no modification or minimal modification of existing scatterometry software. In various embodiments, GDS2LIB can generate a text file that can be implemented with conventional scatterometry software.

Various particular embodiments include a computer-implemented method of generating an integrated circuit (IC) library for use in a scatterometry analysis. The method can include: obtaining chip design data about at least one IC chip; obtaining user input data about at least one IC chip; and running an IC library defining program using the chip design data in its original format and the user input data in its original format, the running of the IC library defining program including: determining a process variation for the at least one IC chip based upon the chip design data and the user input data; converting the process variation into shape variation data; and providing the shape variation data in a text format for use by a scatterometry modeling program in the scatterometry analysis.

Various additional embodiments include a system having: at least one computing device configured to generate an integrated circuit (IC) library for use in a scatterometry analysis by performing actions including: obtaining chip design data about at least one IC chip; obtaining user input data about at least one IC chip; and running an IC library defining program using the chip design data in its original format and the user input data in its original format, the running of the IC library defining program including: determining (the natural or statistical) process variation for the at least one IC chip based upon the chip design data and user input data; converting the process variation into shape variation data; and providing the shape variation data in a text format for use by a scatterometry modeling program in the scatterometry analysis.

Various other embodiments include a computer program product including program code, which when executed on at least one computing device, causes the at least one computing device to generate an integrated circuit (IC) library for use in a scatterometry analysis by performing actions including: obtaining chip design data about at least one IC chip; obtaining user input data about the at least one IC chip; and running an IC library defining program using the chip design data in its original format and the user input data in its original format, the running of the IC library defining program including: determining a process variation for the at least one IC chip based upon the chip design data and the user input data; converting the process variation into shape variation data; and providing the shape variation data in a text format for use by a scatterometry modeling program in the scatterometry analysis.

Turning to the drawings, FIG. 1 depicts an illustrative environment 101 for generating a scatterometry library for use in an integrated circuit (IC) scatterometry analysis according to embodiments. To this extent, the environment 101 includes a computer system 102 that can perform a process described herein in order to generate a scatterometry library. In particular, the computer system 102 is shown as including a GDS library program 18, which makes computer system 102 operable to generate a scatterometry library by performing any/all of the processes described herein and implementing any/all of the embodiments described herein.

The computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the GDS library program 18, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a user (e.g., a human or other user) 22 to interact with the computer system 102 and/or one or more communications devices to enable a system user 22 to communicate with the computer system 102 using any type of communications link. To this extent, the GDS library program 18 can manage a set of interfaces (e.g., graphical user interface(s), application program interface, etc.) that enable human and/or system users 22 to interact with the GDS library program 18. Further, the GDS library program 18 can manage (e.g., store, retrieve, create, manipulate, organize, present, etc.) data, such as IC design and/or test data (including wafer and chip-level data) using any solution.

In any event, the computer system 102 can comprise one or more general purpose computing articles of manufacture (e.g., computing devices) capable of executing program code, such as the GDS library program 18, installed thereon. As used herein, it is understood that "program code" means any collection of instructions or algorithms, in any language, code or notation, that cause a computing device having an information processing capability to perform a particular function either directly or after any combination of the following: (a) conversion to another language, code or notation; (b) reproduction in a different material form; and/or (c) decompression. To this extent, the GDS library program 18 can be embodied as any combination of system software and/or application software.

Further, the GDS library program 18 can be implemented using a set of modules 132. In this case, a module 132 can enable the computer system 102 to perform a set of tasks used by the GDS library program 18, and can be separately developed and/or implemented apart from other portions of the GDS library program 18. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of GDS library program 18 fixed thereon (e.g., one or more modules 132). However, it is understood that the computer system 102 and GDS library program 18 are only representative of various possible equivalent computer systems that may perform a process described herein. To this extent, in other embodiments, the functionality provided by the computer system 102 and GDS library program 18 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as IC design data 142, IC test data 150 and/or IC yield data 155 using any solution. For example, the computer system 102 can generate and/or be used to retrieve IC design data 142, IC test data 150 and/or IC yield data 155 from one or more data stores, receive IC design data 142, IC test data 150 and/or IC yield data 155 from another system, send IC design data 142, IC test data 150 and/or IC yield data 155 to another system, etc. IC design data 142 can include data about a layout of an IC, including design parameters such as spacings, tolerances, dimensions (e.g., line widths), intended current levels, etc., IC test data 150 can include data gathered from testing (either through simulation or physical testing of product(s)) at least a portion of an IC to verify one or more of the design parameters, and IC yield data 155 can include data such as predicted and/or actual yield data about one or more production processes in the formation of the IC (including chip-level, wafer-level, and/or wafer-level data) or a component of the IC (e.g., one or more chip packages).

While shown and described herein as methods, systems, and computer program products for generating a scatterometry library, it is understood that aspects of the invention further provide various alternative embodiments. For example, in one embodiment, the invention provides a computer program fixed in at least one computer-readable medium, which when executed, enables a computer system to generate a scatterometry library. To this extent, the computer-readable medium includes program code, such as the GDS library program 18 (FIG. 1), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the GDS library program 18 (FIG. 1), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for generating a scatterometry library. In this case, a computer system, such as the computer system 102 (FIG. 1), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

Figure 2:
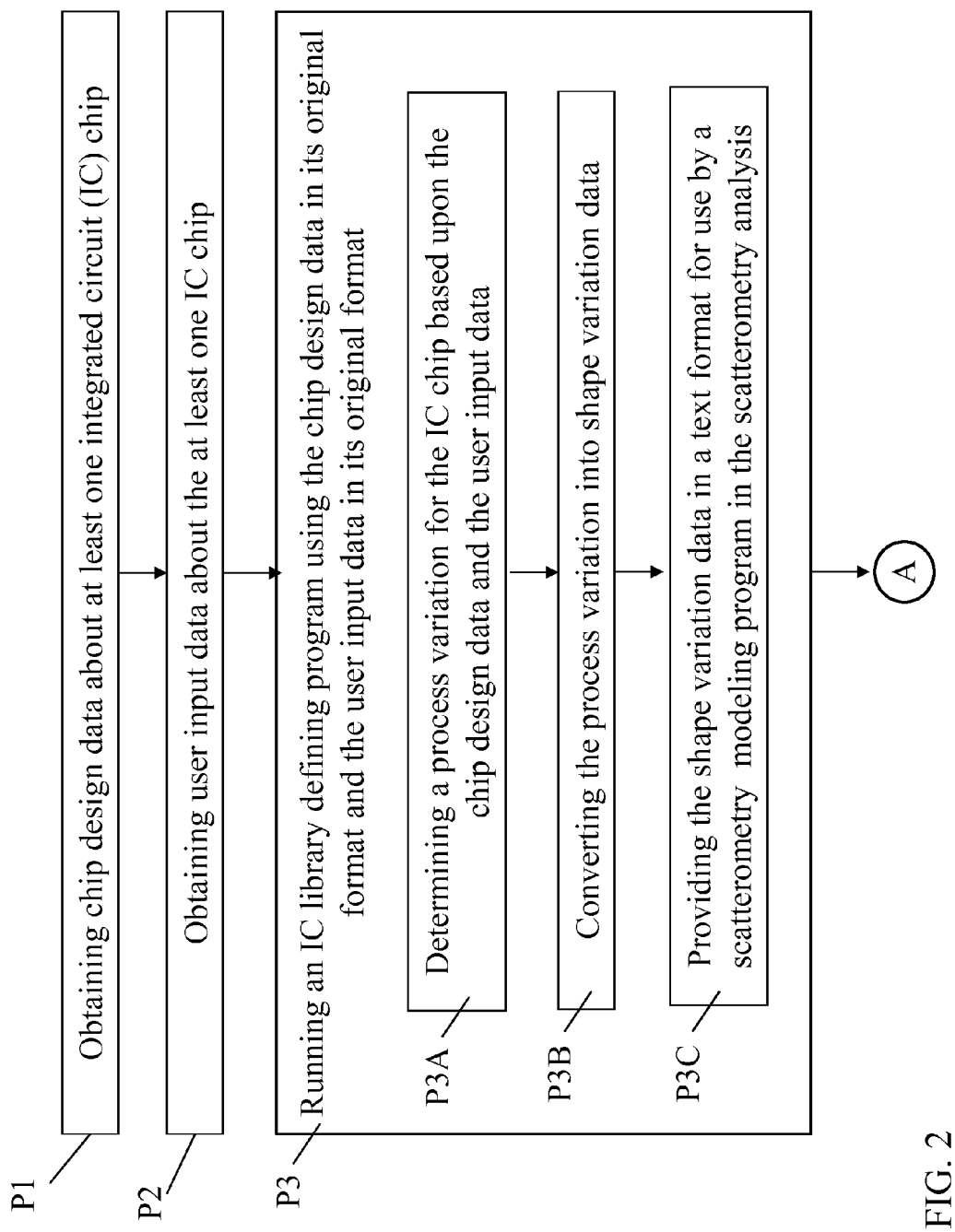
FIGS. 2-4 show flow diagrams depicting processes according to various embodiments.

FIG. 2 shows a flow diagram illustrating a method of generating an integrated circuit (IC) library for use in a scatterometry analysis. The method can include the following processes:

Process P1: obtaining chip design data about at least one IC chip. In some cases, the chip design data can take the form of conventional chip design data in a design file such as GDS, OASIS, S-litho output, Calibre, or OPC.

Process P2: obtaining user input data about at least one IC chip. User input data, as can be entered by a user or another computer program or data file compiled by a user. In some cases, the user input data can include a film stack.

Process P3: running an IC library defining program using the chip design data in its original format and the user input data in its original format. As described further herein, the running of the IC library defining program in Process P3 can include at least the following sub-processes:

Process P3A: determining the process variation for the IC chip based upon the chip design data and the user input data. As is known in the art, determining the process variation can include determining how the fabrication processes may affect formation of the at least one IC chip, e.g., how one or more fabrication processes can cause formation of an IC chip product that naturally or statistically varies from the designed IC chip. In this case, the process variation is calculated based upon both the chip design data and the user input data;

Process P3B: converting the process variation into shape variation data; and

Process P3C: providing the shape variation data in a text format for use by a scatterometry modeling program in the scatterometry analysis.

Figure 3:
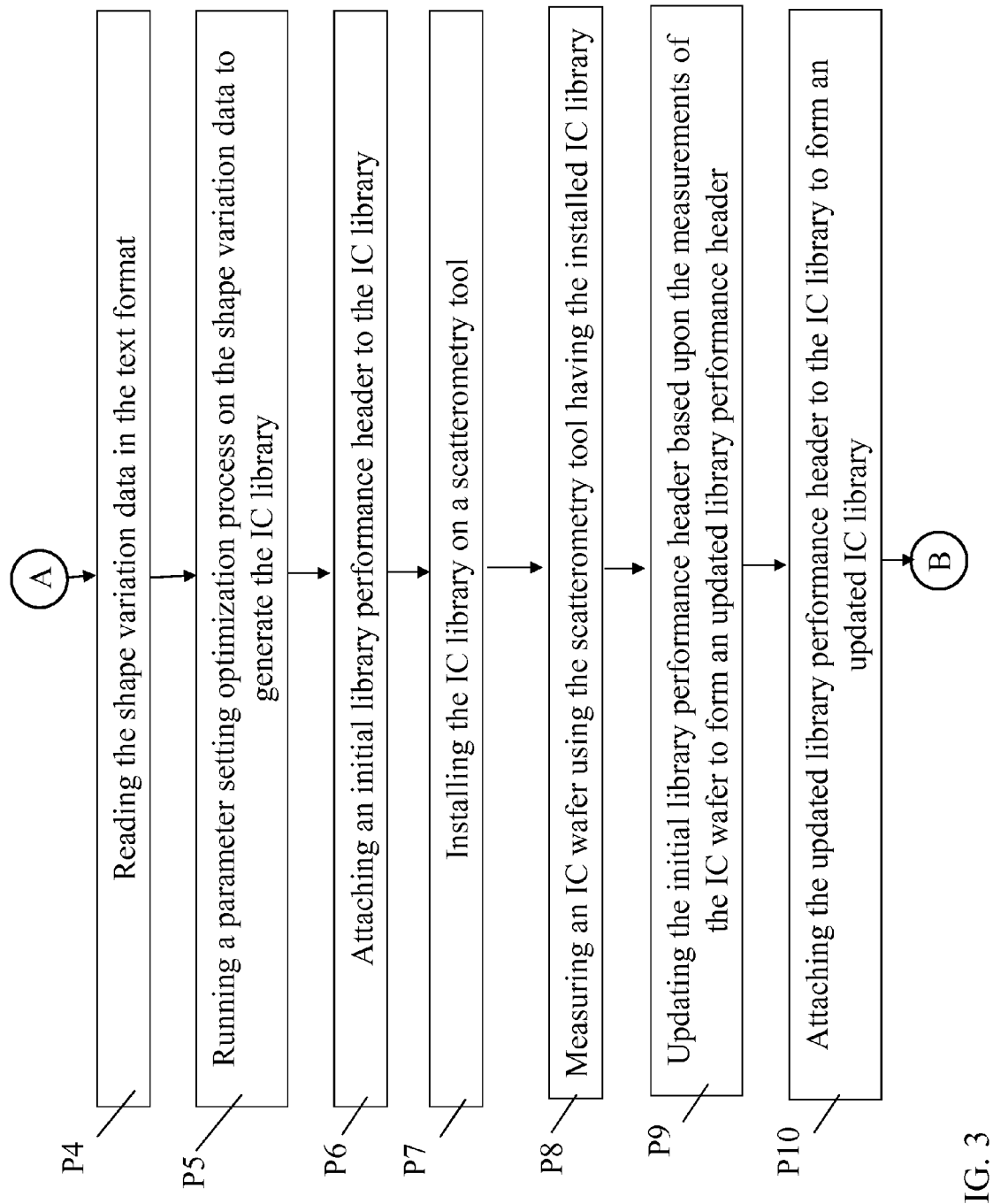

In various embodiments, the method can include additional processes, some of which are illustrated in the flow diagram of FIG. 3. These processes can include:

Process P4: reading the shape variation data in the text format after the providing of the shape variation data in the text format to the scatterometry modeling program.

Process P5: running a parameter setting optimization process on the shape variation data to generate the IC library; and Process P6: attaching an initial library performance header to the IC library. The header includes a text file that carries performance metrics which dictate when the optimization iteration terminates. The initial library performance header can also be referred to as a "smart" library header.

In various additional embodiments, the method can further include:

Process P7: installing the IC library on a scatterometry tool. In this process, the initial library performance header can be produce measurements on wafers in real-time.

Process P8: measuring an IC wafer (e.g., a predetermined number of wafers) using the scatterometry tool having the installed IC library;

Process P9: updating the initial library performance header based upon the measurements of the IC wafer to form an updated library performance header; and Process P10: attaching the updated library performance header to the IC library to form an updated IC library.

Figure 4:
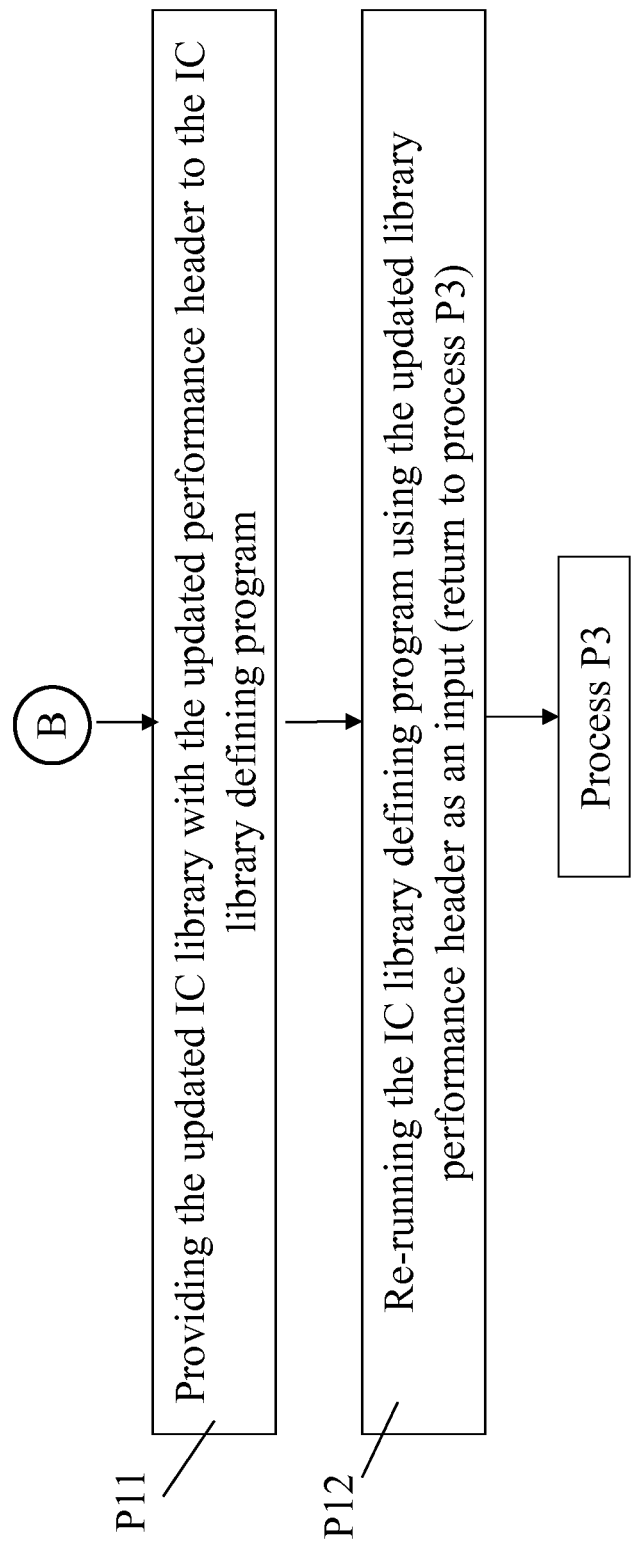

In various embodiments, the method can include additional processes, some of which are illustrated in the flow diagram of FIG. 4. These processes can include:

Process P11: providing the updated IC library with the updated library performance header to the IC library defining program; and Process P12 (loop back to process P3): re-running the IC library defining program using the updated library performance header as an input.

Figure 5:
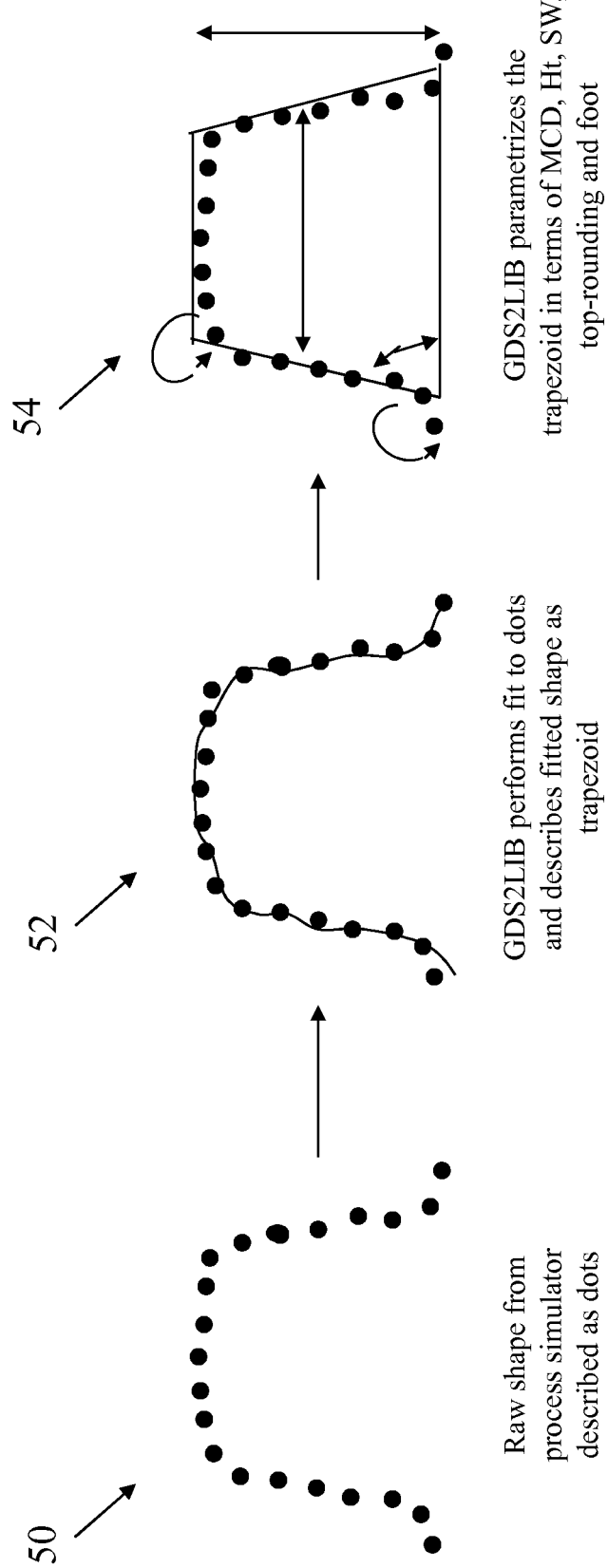
FIGS. 5-6 show example schematic illustrations of processes of transforming raw process variation data into shape variation data according to various embodiments.

An example schematic illustration of process P3 (including sub-processes P3A-P3C) is shown in FIG. 5, where raw process variation data 50 is transformed into shape variation data 54. The GDS library program 18 can obtain the raw process variation data 50, e.g., from a process simulator, shown as dots, perform a fit to the dots (e.g., forming a trapezoid shape 52), and parameterize the trapezoid shape 52 to transform it into shape variation data 54, which accounts for Middle Critical Dimension (MCD), Height (Ht), Sidewall Angle (SWA), top-rounding and/or foot.

Figure 6:
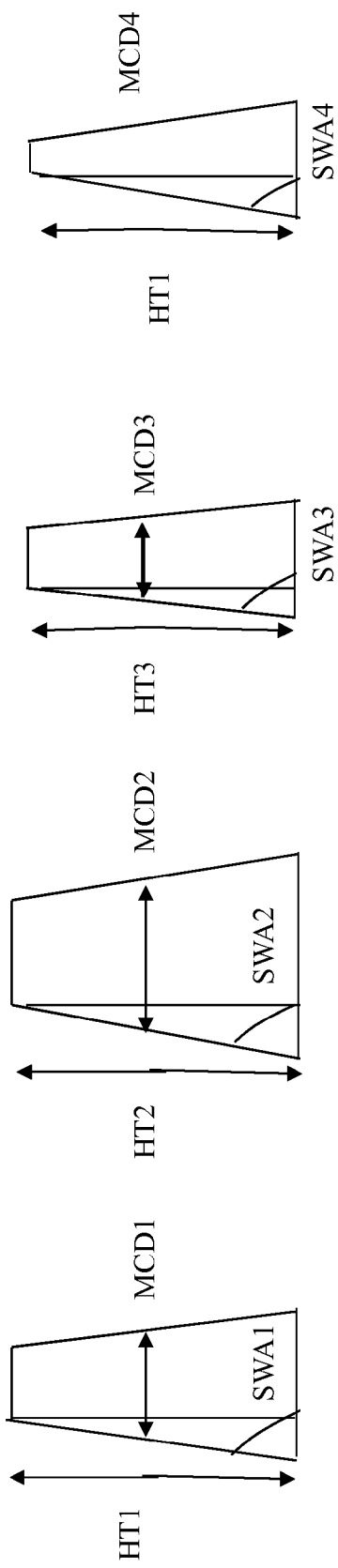

FIG. 6 shows a further illustration of how process variation data can be transformed into shape variation data. In this example, the trapezoid shape 52, is parameterized. A lithographic process simulator can convert dose variations or focus-Exposure Matrix (FEM) to MCD variations, and the GDS library program 18 can perform a subtractive operation to determine the range of resist line parameters. As shown, the MCD range can be calculated as:

$$\text{MCD range} = \max(\text{MCD}i, \text{MCD}j) - \min(\text{MCD}i, \text{MCD}j)$$
where $i,j$ are enumerating indexes spanning all shapes in samples input. (Equation 1)

A similar range can also be calculated for Ht and SWA.

At the first iteration, the GDS library program 18 generates an output text file describing the device structure shape (e.g., trapezoid shape 52) that can be read by a generic scatterometry program. The output text file can comply with the input file format for conventional scatterometry programs. In some cases, the GDS library program 18 can also generate a CAD file (or similar file) along with the output text file.

Figure 7:
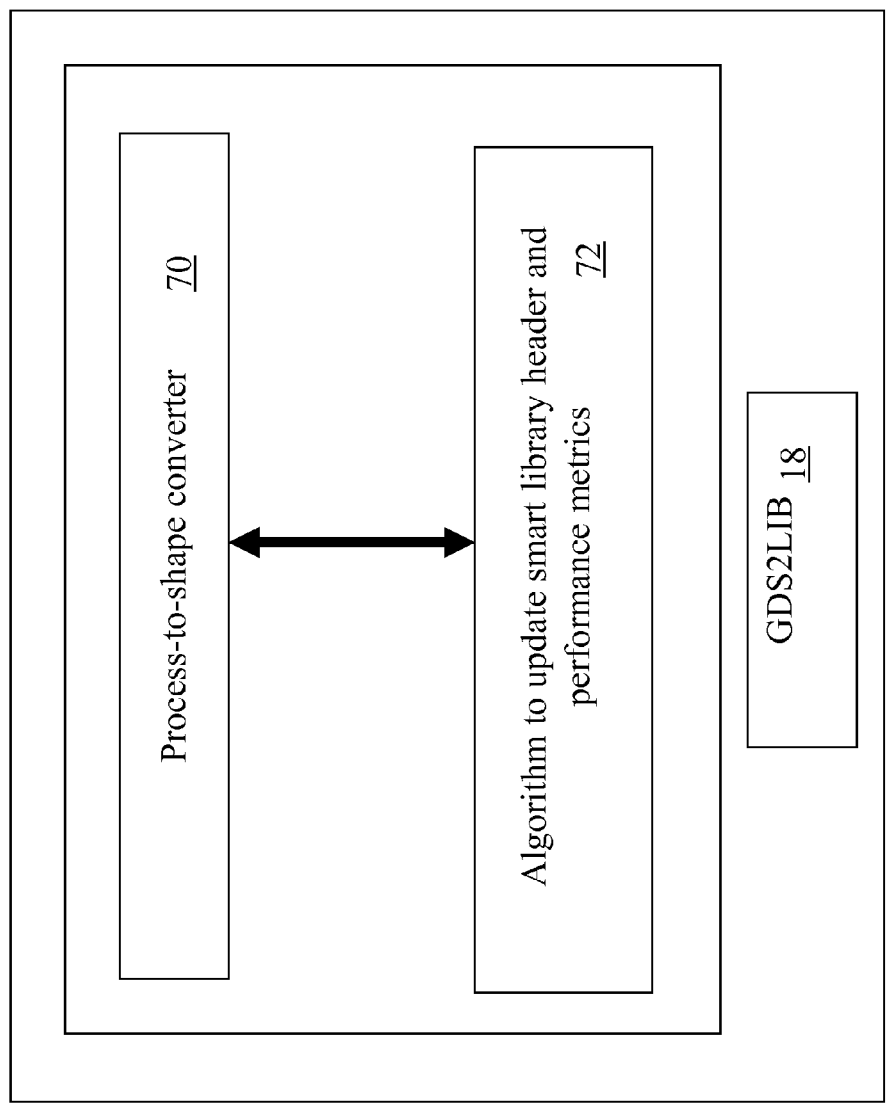
FIG. 7 shows a schematic architectural depiction of a Graphics Data System (GDS) library program according to various embodiments.

FIG. 7 shows a schematic illustration of the GDS library program 18 architecture. As shown, the GDS library program 18 can include a process-to-shape converter 70 and an algorithm 72 to update the smart library header and performance metrics. The GDS library program 18 can evaluate the following parameters, for example: goodness of fit (GOF), weak parameters, inter-correlated parameters, library boundary hits (LBH), general spectra setting (wavelength (WL), numerical aperture (NA), config., etc), process centering within range, process trends (wfr/lot, etc.) across real-time data, total measurement uncertainty (TMU) against reference metrology, library size and library convergence, precision/repeatability and fleet matching, and/or comparison to other look-up tables (e.g., thin film data).

Figure 8:
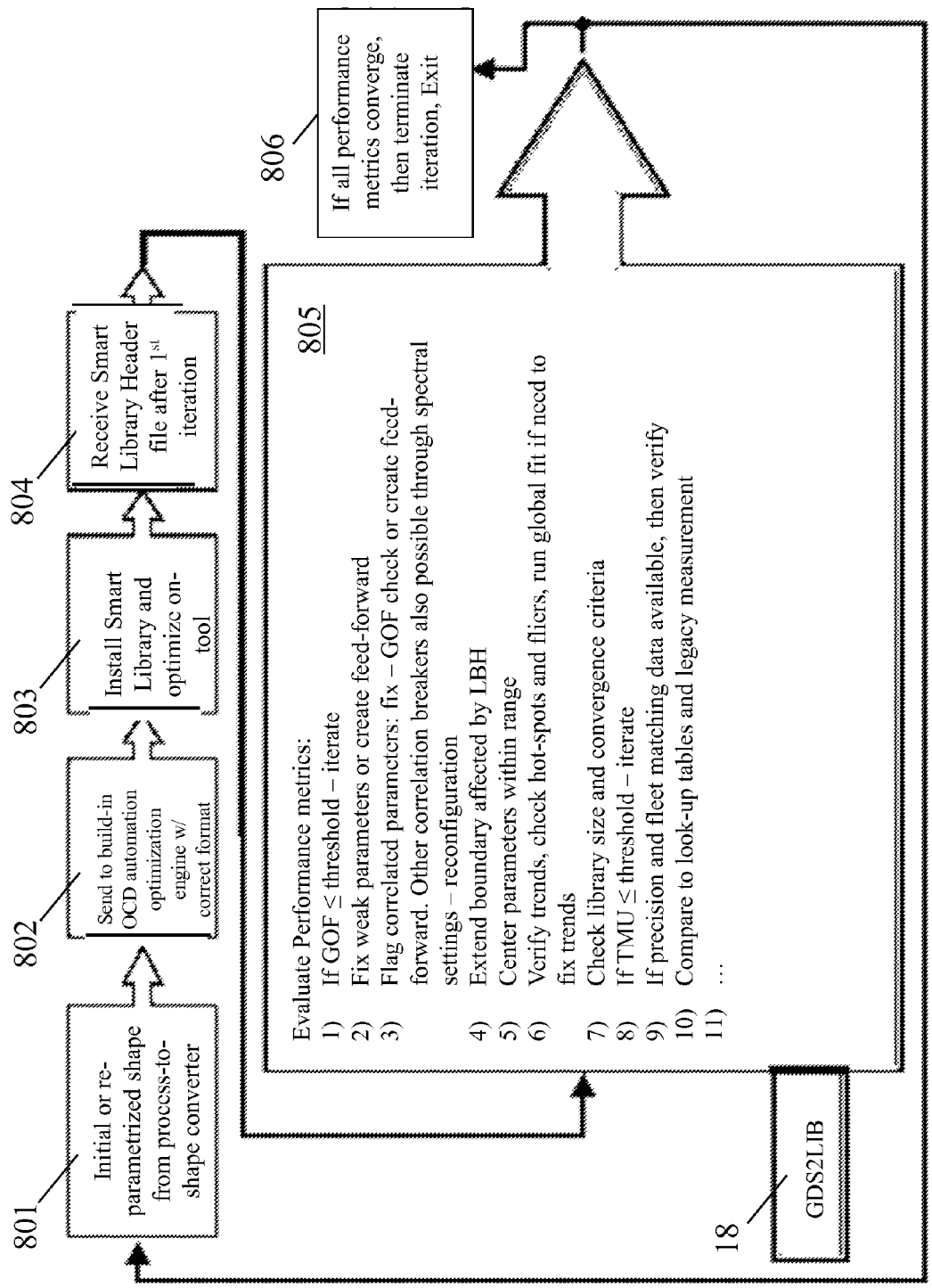
FIG. 8 shows a schematic flow diagram illustrating processes performed by the GDS library program according to various embodiments.

FIG. 8 shows a schematic data-process flow diagram illustrating actions performed by the algorithm portion of the GDS library program 18, along with preliminary processes performed by other systems/programs:

Preliminary process P801: an initial or re-parametrized shape is obtained from the process-to-shape converter;

Preliminary process P802: the initial or re-parameterized shape is sent to a build-in scatterometry automation optimization engine in a compatible format;

Preliminary process P803: the smart library is installed and optimized on-tool;

Preliminary process P804: the smart library header is received after its first iteration;

Process P805 (performed by GDS library program 18): evaluating performance metrics of at least one IC, which can include the following sub-processes:

1) Determine whether GOF is less than or equal to a predetermined threshold; if yes, iterate;
2) Fix weak parameters or create a feed-forward;
3) Flag correlated parameters and fix. This can include checking GOF and creating a feed-forward;
4) Extend the boundary affected by LBH;
5) Center parameters within range;
6) Verify trends, check hot-spots and fliers, run global fit if needed to fix trends;
7) Check library size and convergence criteria;
8) Determine whether TMU is less than or equal to a predetermined threshold; if yes, iterate;
9) If precision and fleet matching data are available, verify that data; and
10) Compare the verified data to look-up tables and legacy measurement; and Post-process P806: If all performance metrics converge, then terminate iteration and end; if not, iterate to preliminary process P801.

Figure 9:
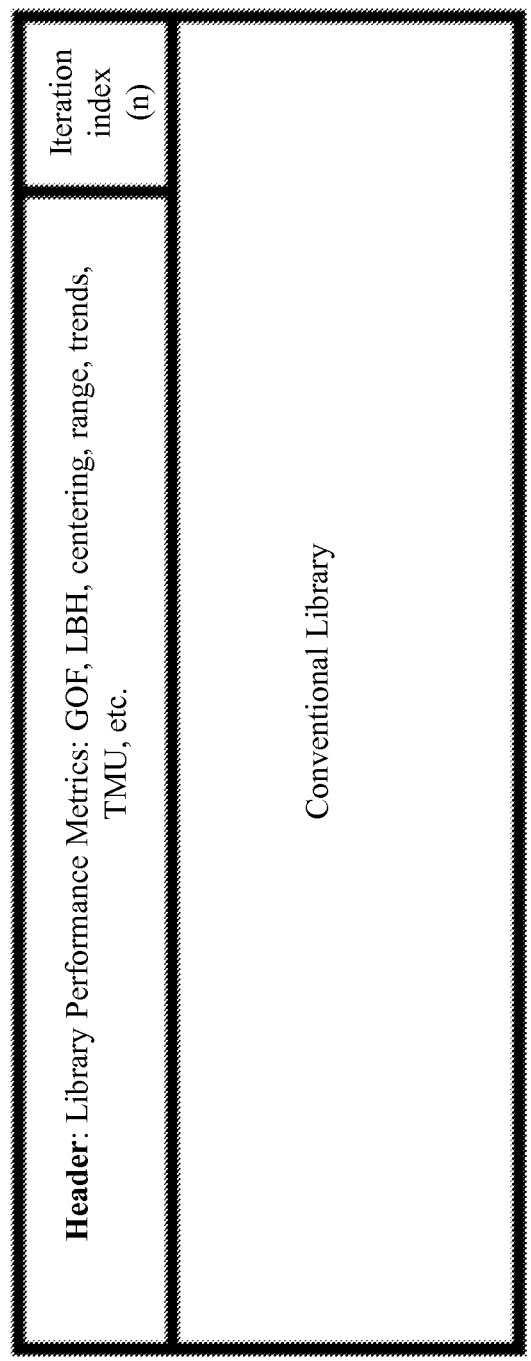
FIG. 9 shows a schematic depiction of a GDS library file according to various embodiments.

FIG. 9 shows a schematic depiction of an example GDS library, including a conventional library component, an iteration index, and a header. The header is a text file generated from the native report.

It is understood that aspects of the invention can be implemented as part of a business method that performs a process described herein on a subscription, advertising, and/or fee basis. That is, a service provider could offer to generate a scatterometry library as described herein. In this case, the service provider can manage (e.g., create, maintain, support, etc.) a computer system, such as computer system 102 (FIG. 1), that performs a process described herein for one or more customers. In return, the service provider can receive payment from the customer(s) under a subscription and/or fee agreement, receive payment from the sale of advertising to one or more third parties, and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

We claim:

1. A computer-implemented method of generating an integrated circuit (IC) library for use in a scatterometry analysis performed on at least one computing device, the method comprising:
obtaining chip design data about at least one IC chip;
obtaining user input data about the at least one IC chip, wherein the user input data includes a film stack file; and
running an IC library defining program using the chip design data in its original format and the user input data in its original format using the at least one computing device, the running of the IC library defining program including:
determining a process variation for the at least one IC chip based upon the chip design data and the user input data;
converting the process variation into shape variation data; and
providing the shape variation data in a text format for use by a scatterometry modeling program in the scatterometry analysis; reading the shape variation data in the text format after the providing of the shape variation data in the text format to the scatterometry modeling program;
running a parameter setting optimization process on the shape variation data to generate the IC library;
attaching an initial library performance header to the IC library,
wherein the initial library performance header includes a text file that carries performance metrics dictating when an optimization iteration terminates;
installing the IC library on a scatterometry tool;
measuring an IC wafer using the scatterometry tool having the installed IC library; and
updating the initial library performance header based upon the measurements of the IC wafer to form an updated library performance header.

2. The computer-implemented method of claim 1, wherein the converting of the process variation into the shape variation includes converting IC shapes from process simulation into scatterometry-readable shapes.

3. The computer-implemented method of claim 2, wherein the scatterometry-readable shapes match scatterometry shape categories selected from the group consisting of: trapezoids, liners, spacers, buried films and fill/recess.

4. The computer-implemented method of claim 1, wherein the original format of the chip design data includes one of: GDS, OASIS, S-Litho output, Calibre or OPC.

5. The computer-implemented method of claim 1, further comprising:
attaching the updated library performance header to the IC library to form an updated IC library.

6. The computer-implemented method of claim 5, further comprising:
providing the updated IC library with the updated library performance header to the IC library defining program; and
re-running the IC library defining program using the updated library performance header as an input.

7. A system comprising:
at least one computing device configured to generate an integrated circuit (IC) library for use in a scatterometry analysis by performing actions including:
obtaining chip design data about at least one IC chip;
obtaining user input data about the at least one IC chip, wherein the user input data includes a film stack file;
running an IC library defining program using the chip design data in its original format and the user input data in its original format, the running of the IC library defining program including:
determining a process variation for the at least one IC chip based upon the chip design data and the user input data;
converting the process variation into shape variation data; and
providing the shape variation data in a text format for use by a scatterometry modeling program in the scatterometry analysis;
reading the shape variation data in the text format after the providing of the shape variation data in the text format to the scatterometry modeling program;
running a parameter setting optimization process on the shape variation data to generate the IC library; and
attaching an initial library performance header to the IC library,
wherein the initial library performance header includes a text file that carries performance metrics dictating when an optimization iteration terminates; installing the IC library on a scatterometry tool;
measuring an IC wafer using the scatterometry tool having the installed IC library; and updating the initial library performance header based upon the measurements of the IC wafer to form an updated library performance header.

8. The system of claim 7, wherein the converting of the process variation into the shape variation includes converting IC shapes from process simulation into scatterometry-readable shapes.

9. The system of claim 8, wherein the scatterometry-readable shapes match scatterometry shape categories selected from the group consisting of: trapezoids, liners, spacers, buried films and fill/recess.

10. The system of claim 7, wherein the original format of the chip design data includes one of: GDS, OASIS, S-Litho output, Calibre or OPC.

11. The system of claim 7, wherein the at least one computing device is further configured to perform:
attaching the updated library performance header to the IC library to form an updated IC library;
providing the updated IC library with the updated library performance header to the IC library defining program; and
re-running the IC library defining program using the updated library performance header as an input.

12. A computer program product comprising program code stored on a non-transitory computer readable medium, which when executed by at least one computing device, causes the at least one computing device to generate an integrated circuit (IC) library for use in a scatterometry analysis by performing actions including:
obtaining chip design data about at least one IC chip;
obtaining user input data about the at least one IC chip, wherein the user input data includes a film stack file; and
running an IC library defining program using the chip design data in its original format and the user input data in its original format, the running of the IC library defining program including:
determining a process variation for the at least one IC chip based upon the chip design data and the user input data;
converting the process variation into shape variation data;
providing the shape variation data in a text format for use by a scatterometry modeling program in the scatterometry analysis; reading the shape variation data in the text format after the providing of the shape variation data in the text format to the scatterometry modeling program;
running a parameter setting optimization process on the shape variation data to generate the IC library;
attaching an initial library performance header to the IC library,
wherein the initial library performance header includes a text file that carries performance metrics dictating when an optimization iteration terminates;
installing the IC library on a scatterometry tool;
measuring an IC wafer using the scatterometry tool having the installed IC library; and
updating the initial library performance header based upon the measurements of the IC wafer to form an updated library performance header.

13. The computer program of claim 12, wherein the converting of the process variation into the shape variation includes converting IC shapes from process simulation into scatterometry-readable shapes,
wherein the scatterometry-readable shapes match scatterometry shape categories selected from the group consisting of: trapezoids, liners, spacers, buried films and fill/recess.

14. The computer program of claim 12, wherein the original format of the chip design data includes one of: GDS, OASIS, S-Litho output, Calibre or OPC.

15. The computer program of claim 12, wherein the program code causes the at least one computing device to further perform:
attaching the updated library performance header to the IC library to form an updated IC library;
providing the updated IC library with the updated library performance header to the IC library defining program; and
re-running the IC library defining program using the updated library performance header as an input.

* * * * *